(12) United States Patent
Kakoschke et al.

(10) Patent No.: US 7,262,456 B2
(45) Date of Patent: Aug. 28, 2007

(54) BIT LINE STRUCTURE AND PRODUCTION METHOD THEREOF

(75) Inventors: Ronald Kakoschke, Munich (DE); Franz Schuler, Poing (DE); Georg Tempel, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/273,668

(22) Filed: Nov. 14, 2005

(65) Prior Publication Data
US 2006/0131637 A1 Jun. 22, 2006

Related U.S. Application Data

(63) Continuation of application No. PCT/EP2004/050525, filed on Apr. 14, 2004.

(30) Foreign Application Priority Data
May 14, 2003 (DE) ................ 103 21 740

(51) Int. Cl.
*H01L 27/788* (2006.01)
*H01L 21/366* (2006.01)
(52) U.S. Cl. .............. 257/315; 257/508; 257/758; 257/E21.682; 257/E27.103; 438/300; 438/304

(58) Field of Classification Search ........... 257/315, 257/508, 758
See application file for complete search history.

(56) References Cited

U.S. PATENT DOCUMENTS

| | | | |
|---|---|---|---|
| 4,939,567 A * | 7/1990 | Kenney | 257/383 |
| 5,544,103 A | 8/1996 | Lambertson | |
| 5,760,452 A | 6/1998 | Terada | |
| 5,859,466 A * | 1/1999 | Wada | 257/508 |
| 6,438,030 B1 | 8/2002 | Hu et al. | |
| 2003/0087519 A1 | 5/2003 | Manger et al. | |

FOREIGN PATENT DOCUMENTS

| | | |
|---|---|---|
| DE | 100 62 245 A1 | 7/2002 |
| EP | 1 045 440 A1 | 10/2000 |

* cited by examiner

*Primary Examiner*—Howard Weiss
(74) *Attorney, Agent, or Firm*—Brinks Hofer Gilson & Lione

(57) ABSTRACT

The disclosure relates to a bit line structure and an associated production method for the bit line structure. In the bit line structure, at least in a region of a second contact and a plurality of first contact adjoining the latter, an isolation trench is filled with an electrically conductive trench filling layer. The isolation trench connects to the first doping regions adjoining the second contact for the purpose of realizing a buried contact bypass line.

19 Claims, 10 Drawing Sheets

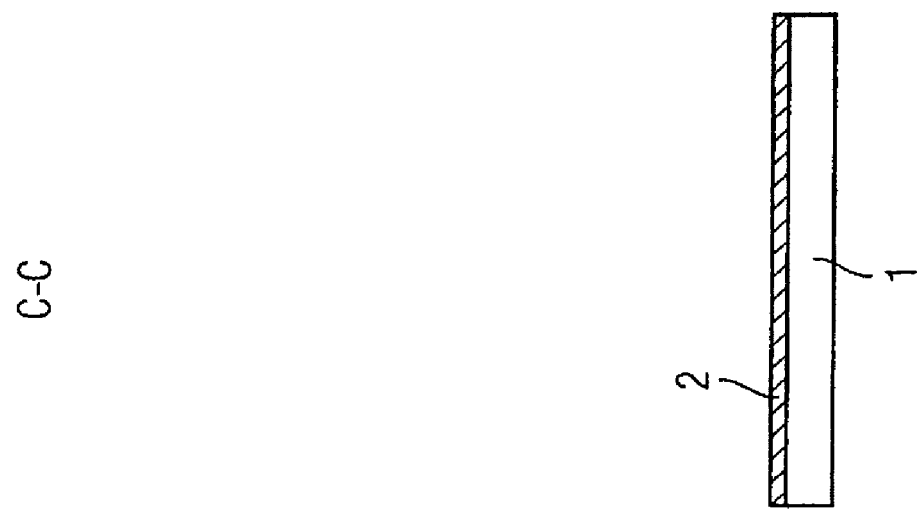
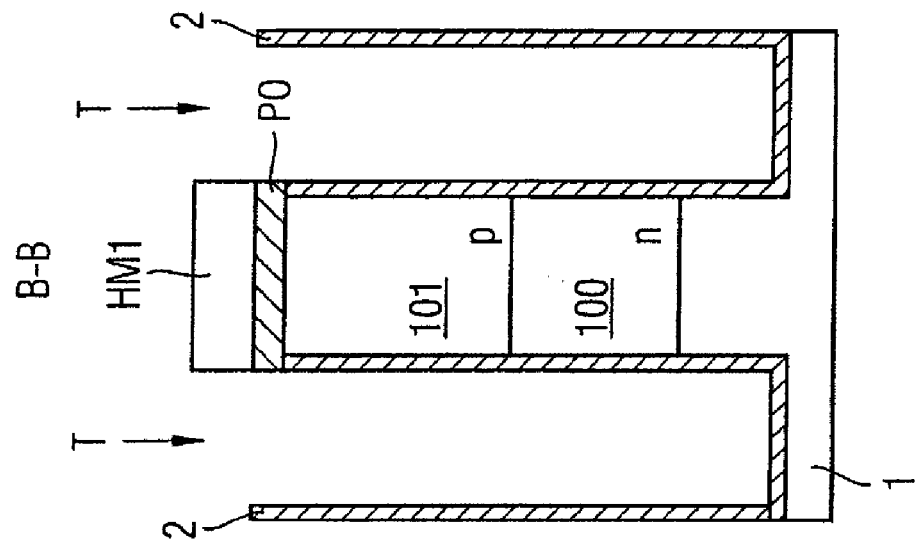
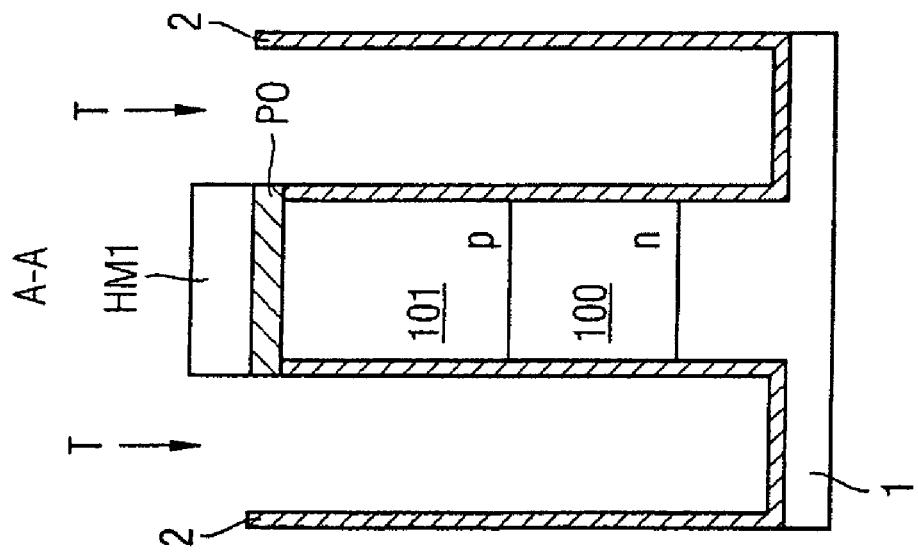

C-C

B-B

A-A

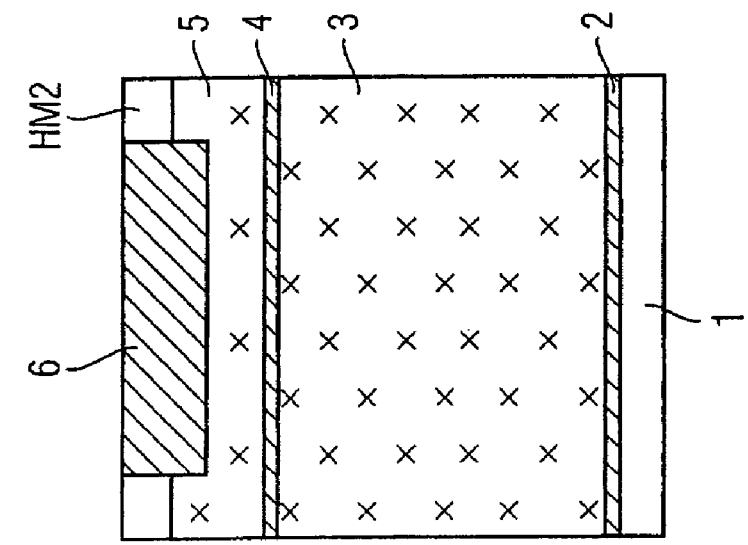
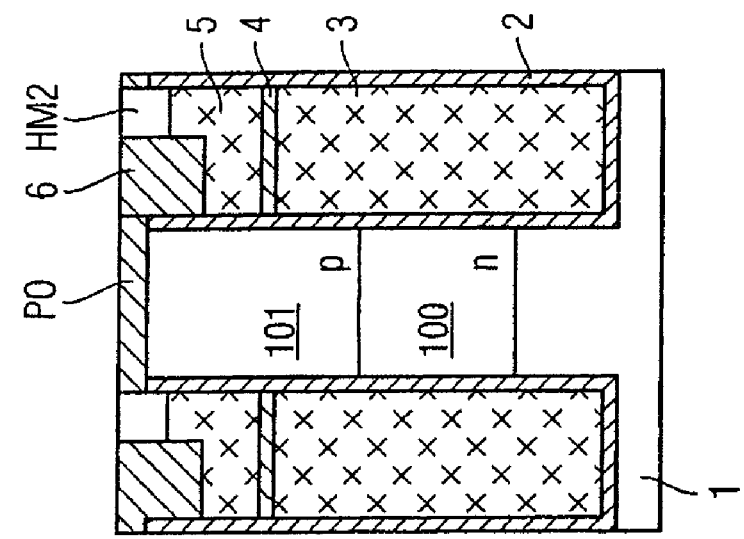
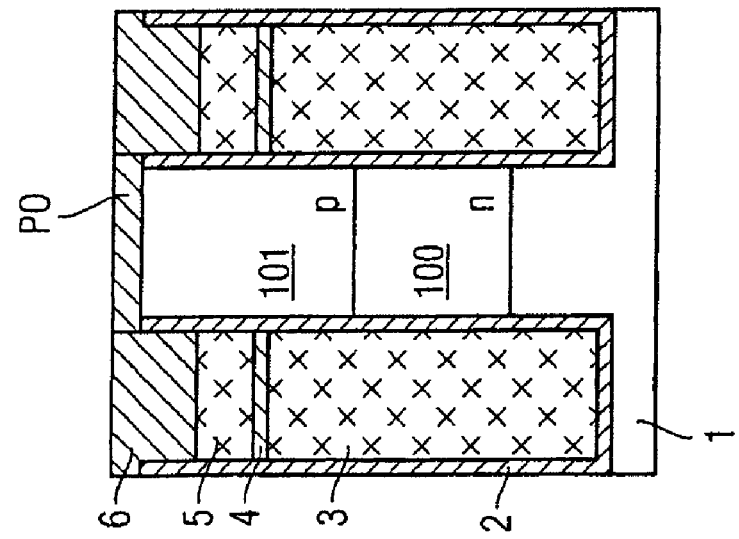

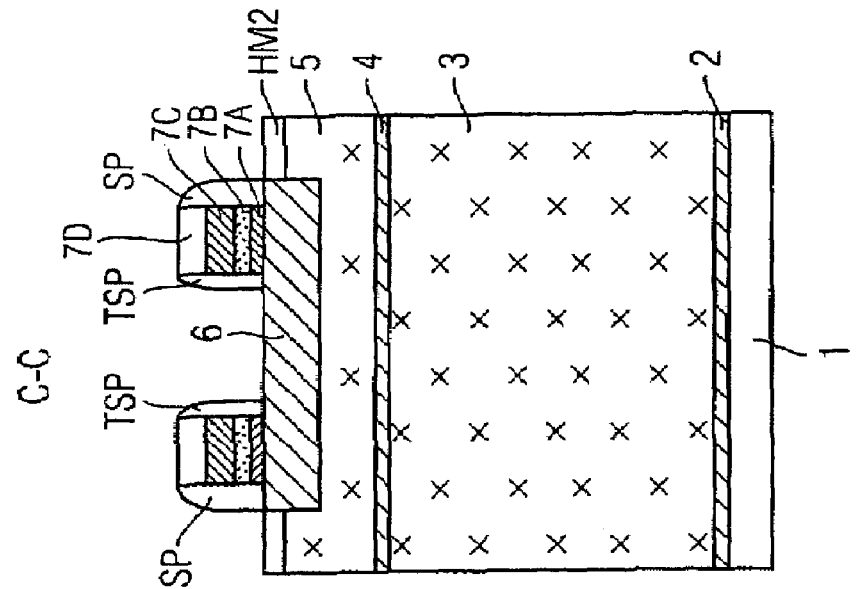
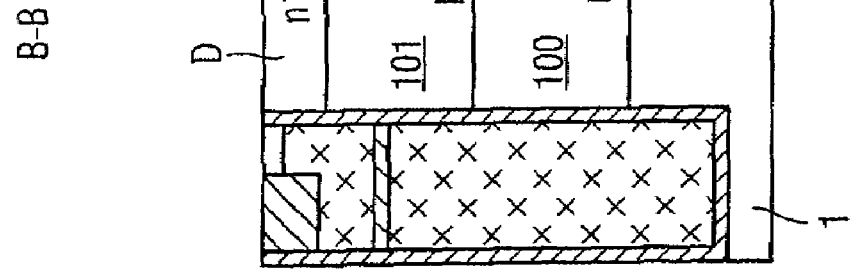
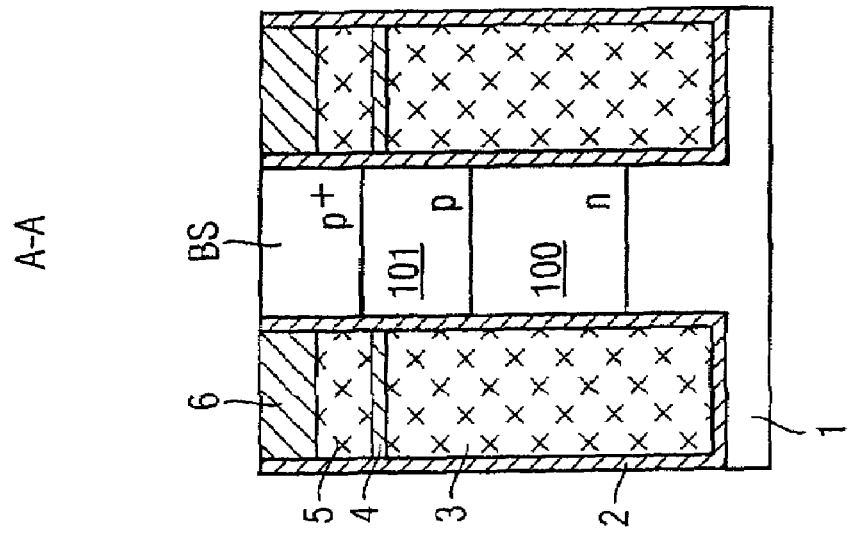

BIT LINE STRUCTURE AND PRODUCTION METHOD THEREOF

RELATED APPLICATIONS

The present patent document is a continuation of PCT Application Serial No. PCT/EP2004/050525, filed Apr. 14, 2004, designating the United States and published in English, which claims priority to German Application Serial No. DE 10321740.1, filed May 14, 2003, the entirety of which are both hereby incorporated by reference.

BACKGROUND

The present invention relates to a bit line structure and to a production method therefor, and in particular to a sub-100 nm bit line structure and an associated production method, as can be used in a non-volatile SNOR memory circuit for the respective selective driving of source and drain lines.

In the realization of memory circuits, a distinction is made in principle in terms of the memory architecture, the so-called NAND and NOR architectures being represented most commonly. In both architectures, for example so-called one-transistor memory cells are arranged in matrix-type fashion and driven via so-called word and bit lines.

While in NAND architectures a multiplicity of switching elements or memory elements are connected to one another serially and are driven via a common selection gate or a selection transistor, the respective switching elements in NOR architectures are organized in parallel or in matrix-type fashion, as a result of which each switching element can be selected individually.

FIG. 1A shows a simplified illustration of a so-called SNOR architecture (Selective NOR), in which, in contrast to the NOR architecture with a "common source" construction, the individual switching elements SE1, SE2, . . . are selectively driven via a respective source line SL1, SL2, . . . and via a respective drain line DL1, DL2,. . . . This selective driving is carried out for example by means of respective bit line controllers BLC, which as it were realize the common bit lines BL1, BL2., . . . In this way, it is possible to carry out further shrinks or more extensive integration of semiconductor circuit arrangements, since the SNOR architecture does not rely on a predetermined minimum cell transistor length or channel length.

FIG. 1B shows a simplified illustration of a conventional layout of the SNOR architecture in accordance with FIG. 1A. In accordance with FIG. 1B, the switching elements or memory elements SE1, SE2, . . . are formed in active areas AA of a semiconductor substrate which have a substantially straight strip-type structure. The multiplicity of strip-type active areas AA arranged in columns have superposed on them in rows layer stacks or word line stacks WL1, WL2, . . . that are likewise formed in strip-type fashion. Each crossover point or overlap area between such a strip-type active area AA and a word line stack WL formed in strip-type fashion thus constitutes a multiplicity of semiconductor components or memory elements SE.

Contacts are necessary for making contact with respective drain regions D and source regions S, said contacts usually being formed above the active areas AA, but they may often also reach into an adjoining isolation region STI (Shallow Trench Isolation). In a further overlying layer, which preferably represents a first metallization layer, there are then situated the source lines SL1, SL2, . . . and also the drain lines DL1, DL2, . . . for the respective bit lines BL. In this case, the drain lines are connected to the associated drain regions D of the active area AA via corresponding drain contacts KD, the source lines SL being connected to the associated source regions S via corresponding source contacts KS in the same way.

What is disadvantageous, however, about such a conventional bit line structure is that, on account of the additional source lines, metallization that is more than twice as dense compared with a "common source" architecture is present, which represents a limiting factor for more extensive integration or further shrinks.

BRIEF SUMMARY

In order to improve an integration density, it has therefore been proposed in accordance with document DE 100 62 245 A1 to form the source and drain lines as spacers at an insulating fin and to enable contact to be made with the associated source and drain regions by means of an additional insulating layer with corresponding openings. However, the space requirement, on account of the source and drain lines that are formed at the substrate surfaces and lie parallel, is still relatively high and prevents more extensive integration.

FIGS. 2A and 2B show a simplified equivalent circuit diagram and also a simplified sectional view of a further bit line structure, as is known for example from the document U.S. Pat. No. 6,438,030 B1.

In accordance with FIGS. 2A and 2B, in this case the drain line DL1, DL2, . . . is again formed as a surface bit line at a surface of a substrate 100, in which are formed mutually insulated p-type wells 101, 102, . . . for the realization of a buried source line BSL1 in the semiconductor substrate.

For contact-connecting the respective source regions S to the buried source line BSL or the p-type wells 101, 102, . . . , a so-called buried strap or a buried connection layer BS is formed in contact with the source regions S as a p-type doping region which reaches right into the p-type well 101. Via a silicide layer 8 formed at the surface, it is possible in this case for the source region S to be electrically connected to the buried connection layer BS and thus to the buried source line BSL. In this way, each source region S of the semiconductor components SE is electrically connected to the p-type well 101 or the buried source line BSL.

On the other hand, the drain regions D in accordance with FIG. 2B are electrically connected to the surface bit line DL1 via drain contacts KD. Furthermore, each p-type well or buried source line BSL is electrically connected via a well connection doping region WA and an associated source contact KS to a surface source line SL1 routed at the surface. In order to realize sufficiently low contact resistances, source contacts KS of this type are usually formed every 32 to 64 cells in the semiconductor substrate.

The integration density can be considerably improved in this way, since the source line is essentially formed as a buried source line BSL in the semiconductor substrate and correspondingly relaxes the requirements made of the metallization at the substrate surface. What is disadvantageous, however, is that a loss of area still arises in particular at the locations of the source contacts KS on account of a line overlap between the surface drain line DL1 and the surface source line SL1.

Therefore, the invention is based on the object of providing a bit line structure and an associated production method enabling a further area optimization.

In particular through the use of an isolation trench filled with an electrically conductive trench filling layer at least in the region of the second contact and the first contacts adjoining the latter, the trench filling layer electrically connecting to one another the first doping regions adjoining the second contact for the purpose of realizing a buried contact bypass line, the requirements made of the metallization can be relaxed further, as a result of which area-optimized bit line structures can be realized.

Preferably, the isolation trench has a first trench insulating layer formed at its trench surface, an electrically conductive or nonconductive shielding layer formed at the surface of the first trench insulating layer, and a second trench insulating layer, which is formed on the surface of the shielding layer, the trench filling layer being situated in the upper section of the isolation trench, as a result of which semiconductor components having outstanding electrical properties and, in particular, insulation properties can be realized in particular also for sub-100 nm structures.

Preferably, the second contact is situated essentially above the buried connection layer, as a result of which an additional well contact-connection can be dispensed with and a further improved area optimization is obtained.

In particular through the use of a self-aligning highly conductive connection layer, the electrical connections between the first or second contacts and the associated doping regions and also the trench filling layer can be carried out in a particularly simple and effective manner.

Preferably, the substrate furthermore has a well doping region, in which the bit line doping region is situated, the isolation trench projecting beyond the well doping region. The insulation properties between adjacent cells can be substantially improved further in this way.

Further advantageous refinements of the invention are characterized in the further claims.

BRIEF DESCRIPTION OF THE DRAWINGS

The invention is described in more detail below on the basis of an exemplary embodiment with reference to the drawing.

FIGS. 4A to 9C show simplified sectional views of the semiconductor circuit arrangement in accordance with FIG. 3A for illustrating essential method steps in the production of a bit line structure according to the invention.

DETAILED DESCRIPTION OF THE DRAWINGS

Figure 1B:
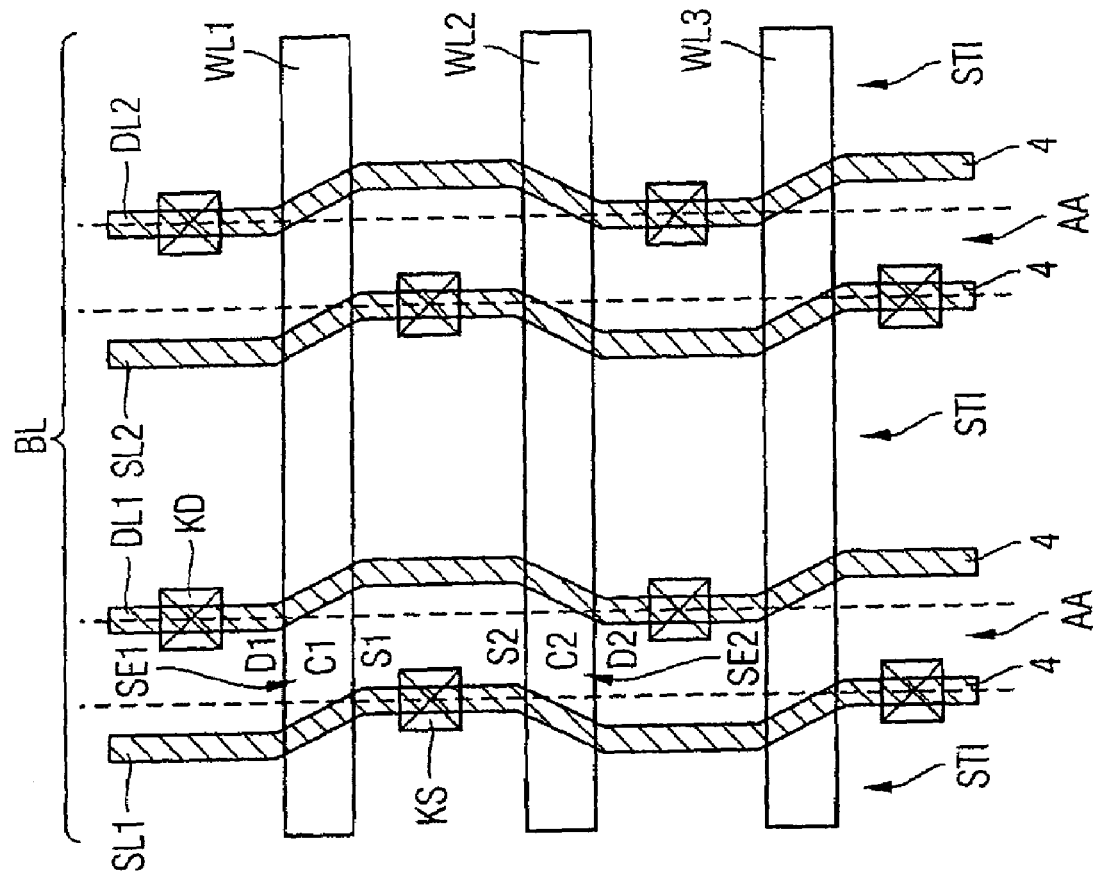
FIGS. 1A and 1B show a simplified equivalent circuit diagram and a simplified plan view of a layout of a conventional bit line structure in an SNOR memory circuit.
Figure 1A:
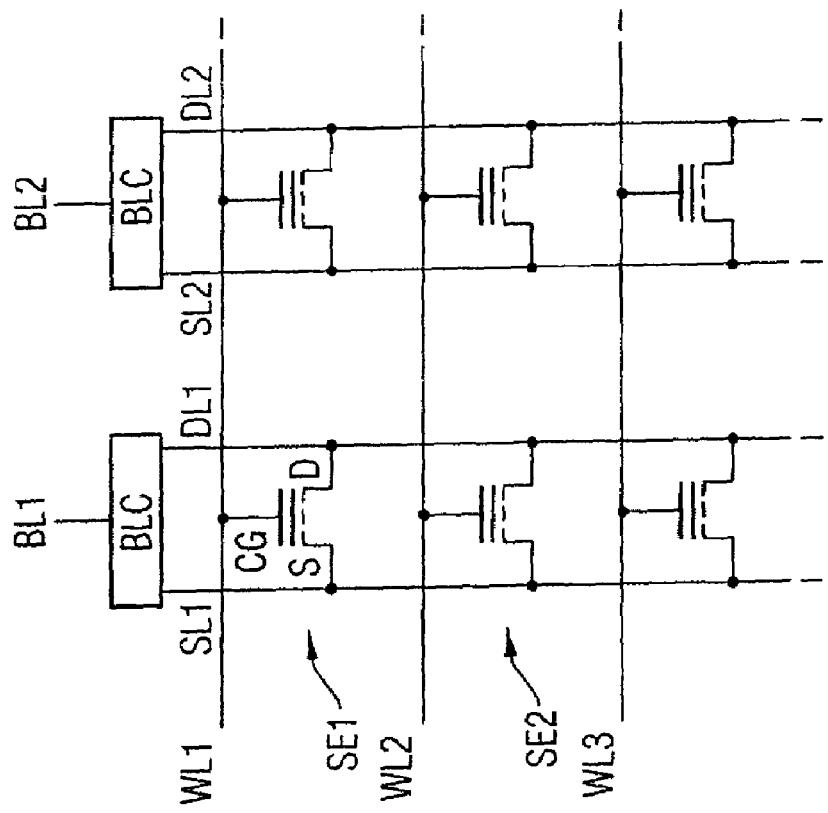
Figure 2A:
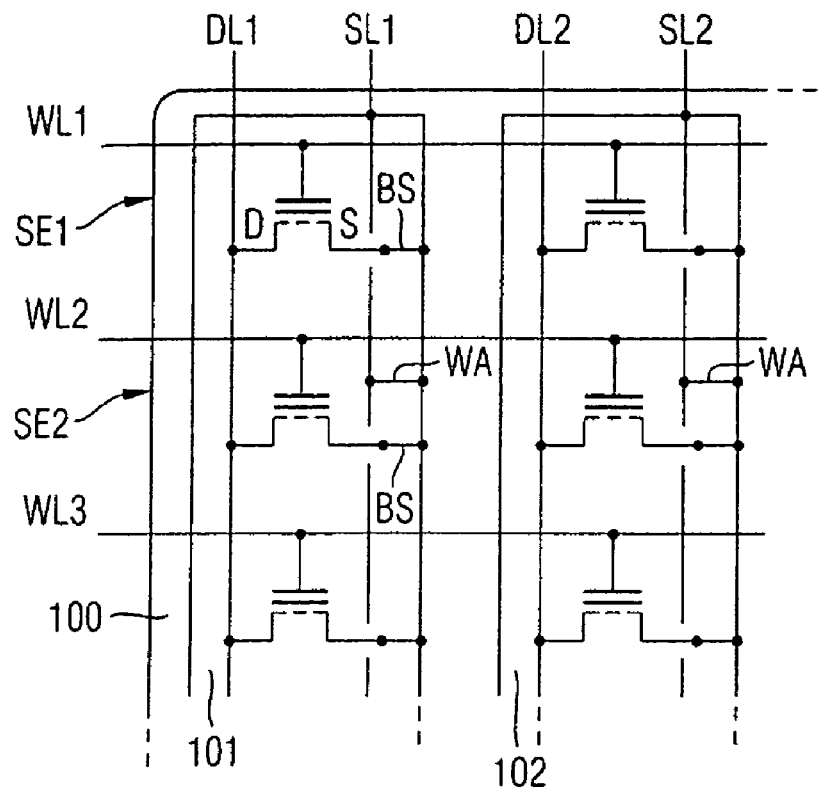
FIGS. 2A and 2B show a simplified equivalent circuit diagram and an associated sectional view of a further conventional bit line structure.
Figure 2B:
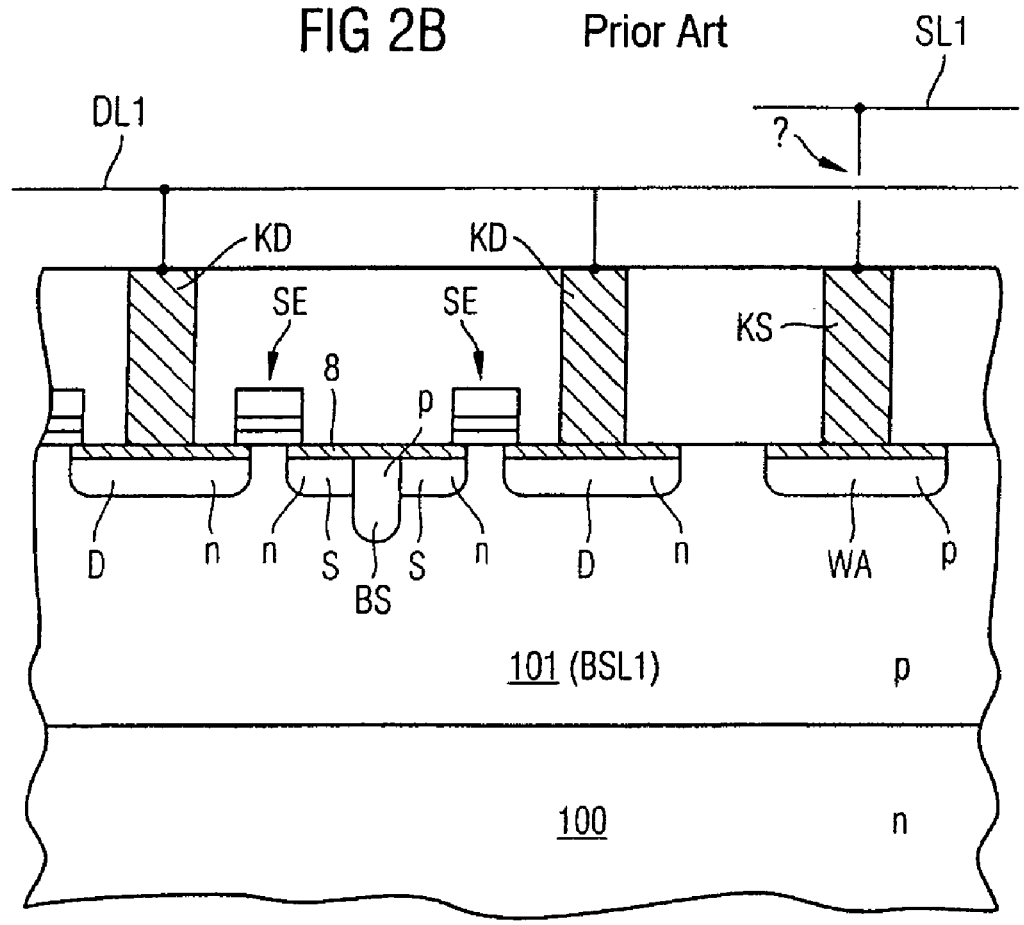
Figure 3A:
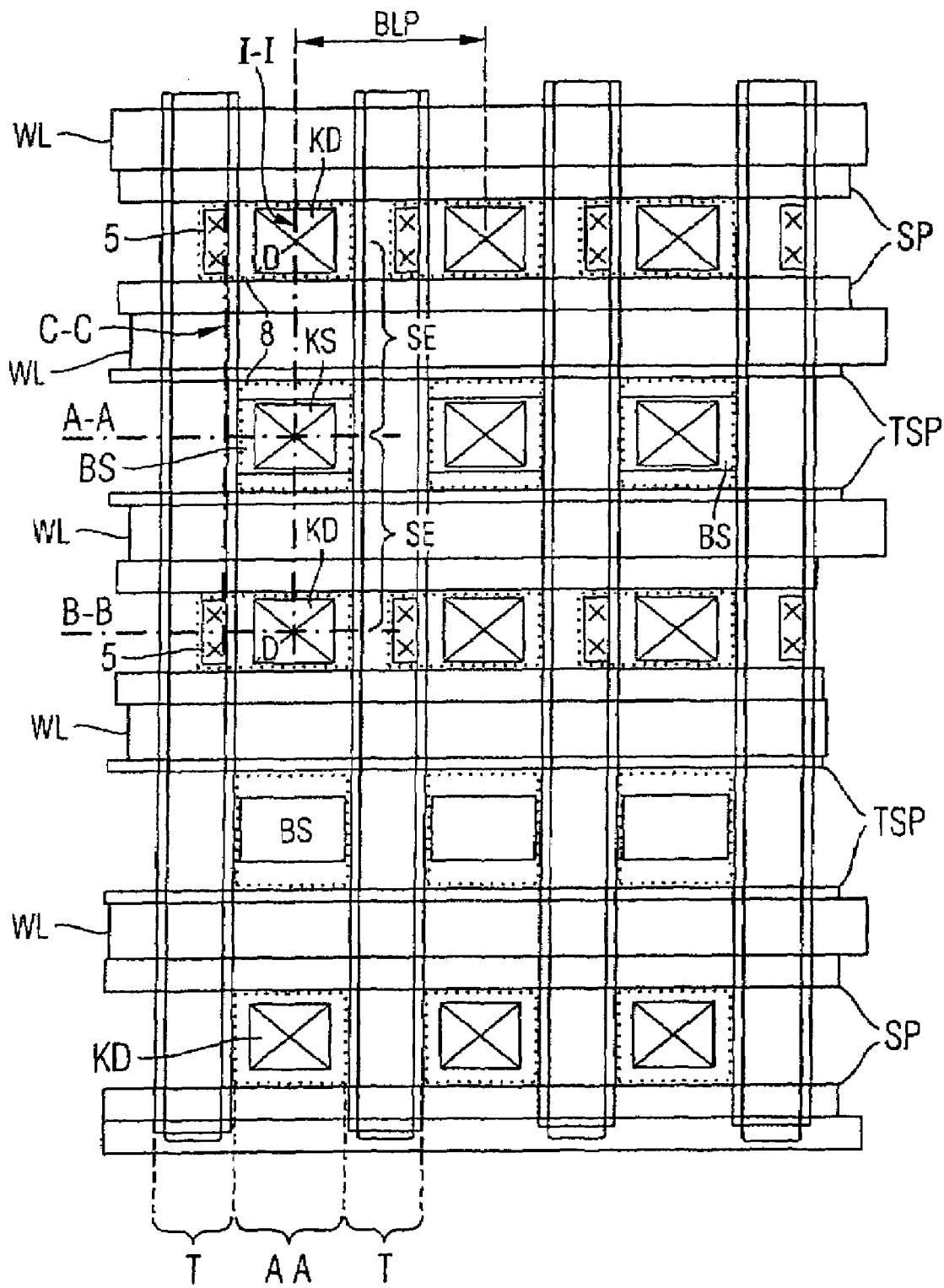
FIGS. 3A and 3B show a simplified plan view of a layout and an associated sectional view along a section I-I of a semiconductor circuit with a bit line structure according to the invention.
Figure 3B:
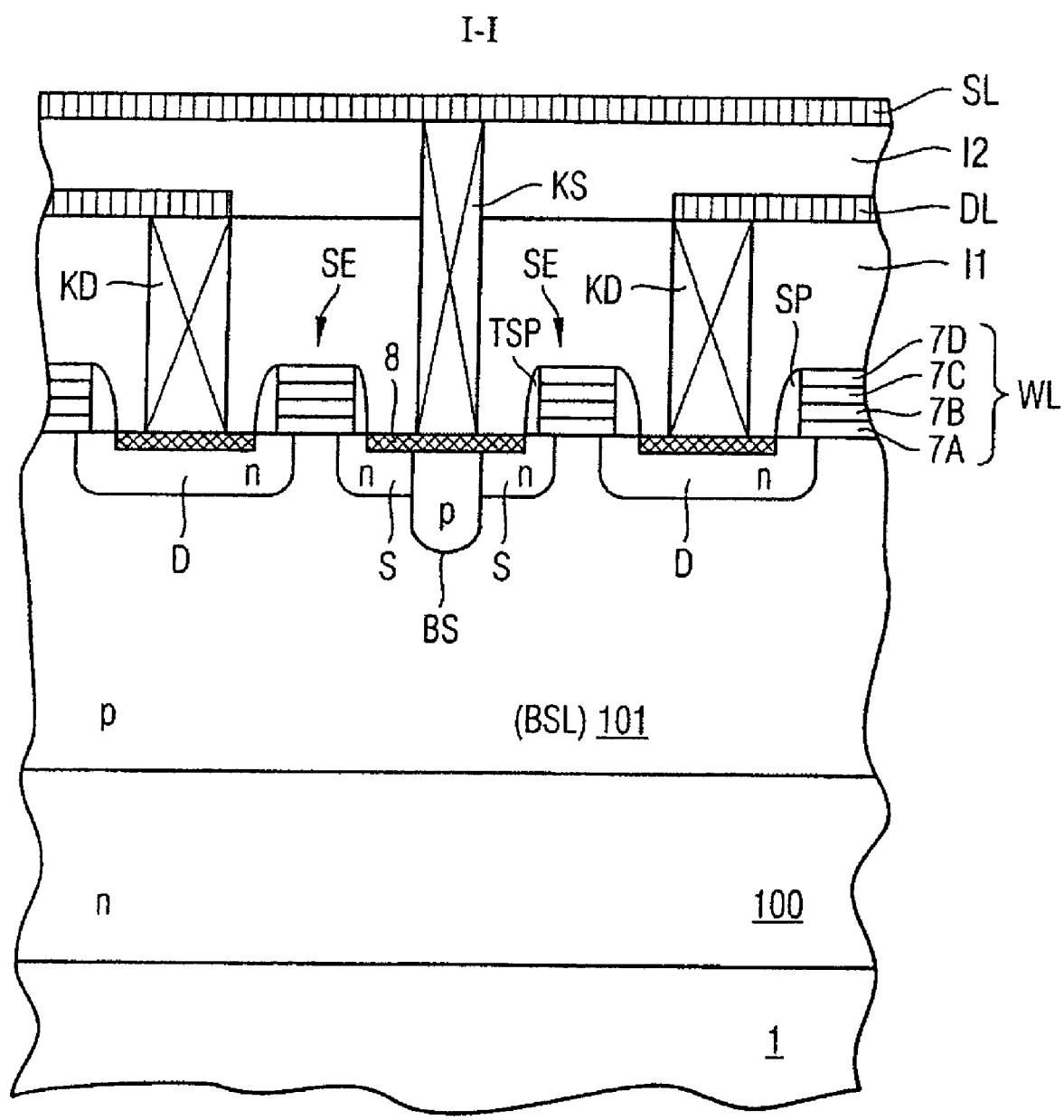

FIGS. 3A and 3B show a simplified plan view of a layout of a semiconductor circuit and also an associated sectional view along a section I-I for illustrating a bit line structure according to the invention, identical reference symbols designating elements or layers identical or corresponding to those in FIGS. 1A to 2B, for which reason a repeated description is dispensed with below.

In this case, FIG. 3A shows a simplified plan view of a layout of a bit line structure according to the invention as can be used in an SNOR semiconductor memory circuit, by way of example.

In accordance with FIGS. 3A and 3B, in a substrate, which has for example a semiconductor substrate and preferably crystalline silicon, by means of a multiplicity of strip-type isolation trenches T, a multiplicity of strip-type active areas AA are formed in column-type fashion in the substrate. As in the prior art in accordance with FIG. 1B, word line stacks WL are formed in row-type fashion perpendicular to said strip-type active areas AA at the surface of the substrate, said word line stacks, in order to realize for example nonvolatile memory elements SE as semiconductor components, having a first insulating layer 7A, such as e.g. a gate oxide layer or a tunnel layer, a charge-storing layer 7B, such as e.g. a floating gate layer, a second insulating layer 7C, such as e.g. an ONO layer sequence (oxide/nitride/oxide), and a control layer 7D as the actual driving word line.

Sidewall insulating layers or spacers SO are formed at the sidewalls of the word line stacks WL for insulation purposes, the spacers which point toward a second contact or source contact KS being processed or trimmed and having a reduced thickness. These spacers SP or trimmed spacers TSP usually comprise a multiplicity of spacer layers, whereby it is possible to realize a sufficient insulation and the associated connection doping regions or actual first and second or drain and source doping regions D and S. A detailed description of these layers and of the associated spacers and doping regions is dispensed with at this point since they are sufficiently known to the person skilled in the art.

Accordingly, a semiconductor component or a non-volatile memory element SE is formed at each crossover point or overlap point between the active areas AA and the word line stacks WL, said element having, in order to realize a field effect transistor structure, drain regions D and source regions S as first and second doping regions of a first conduction type such as e.g. $n^+$ at the sides of the word line stacks.

In order to realize the area-optimized bit line structure according to the invention, the isolation trench T is now filled with an electrically conductive trench filling layer 5 at least in the region of the second contact or source contact KS and the first contacts or drain contacts KD adjoining the latter, which trench filling layer, in order to realize a buried contact bypass line, electrically connects to one another the first doping regions D adjoining the second contact KS or the adjoining first contacts KD.

Figure 9C:
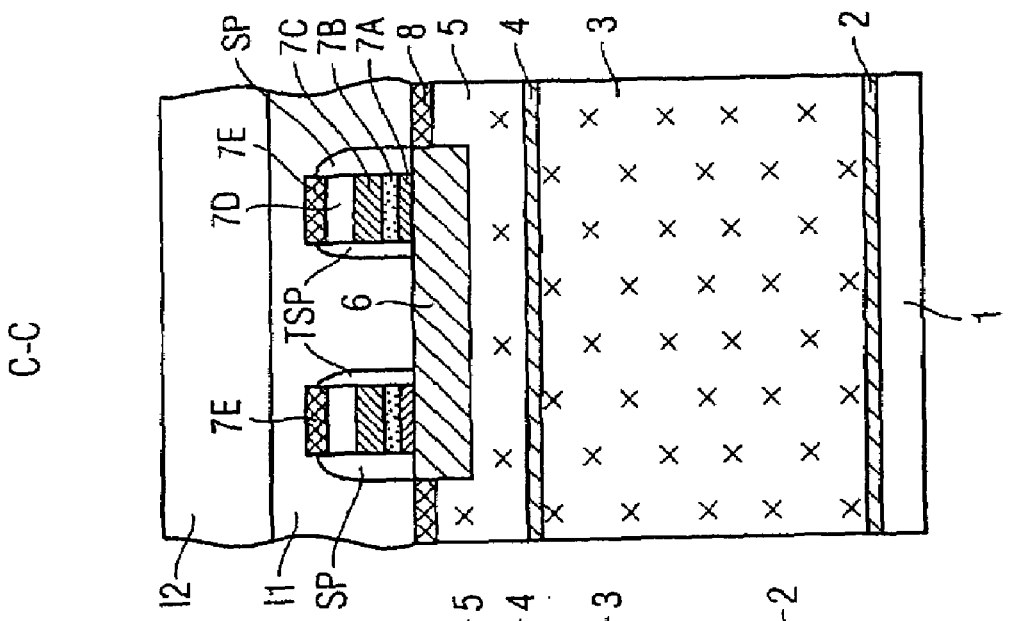
Figure 9B:
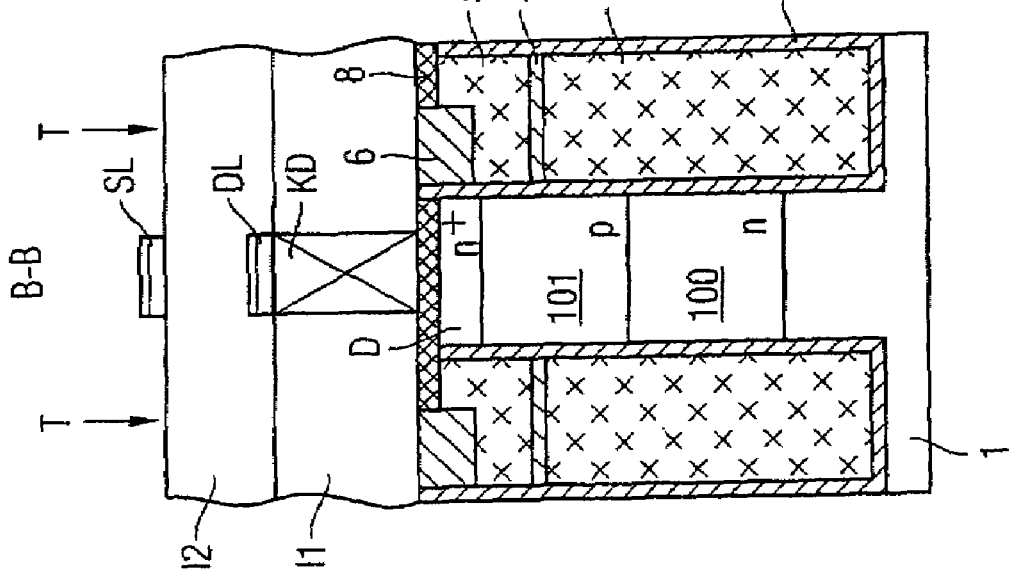
Figure 9A:
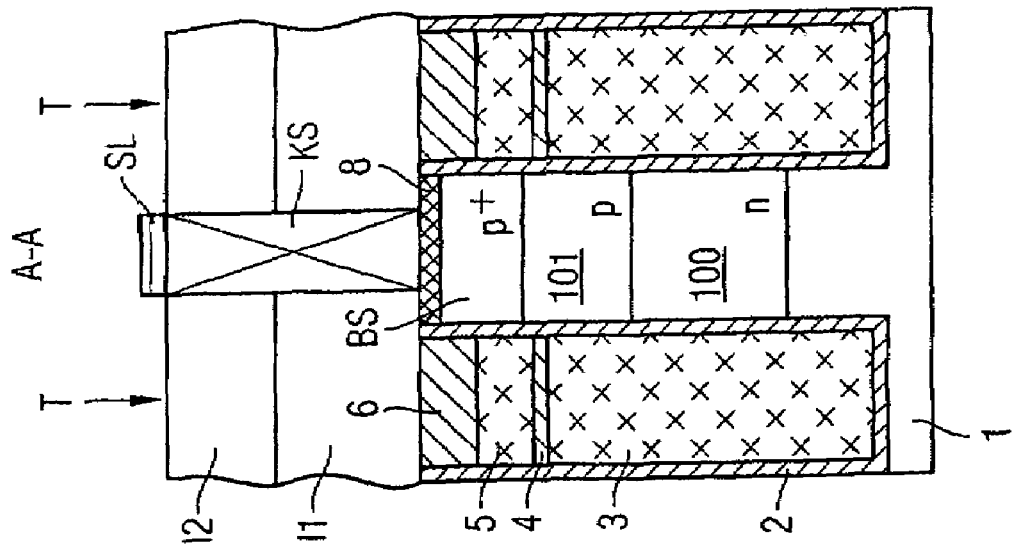

FIGS. 9A to 9C show further simplified sectional views of the semiconductor circuit arrangement in accordance with FIG. 3A along a section A-A, B-B and C-C, identical reference symbols once again designating layers or elements identical or corresponding to those in FIGS. 1 to 3B and a repeated description being dispensed with below.

In accordance with these sectional views and also the associated plan view, the isolation trench T accordingly has a first trench insulating layer 2 formed at its trench surface, a shielding layer 3 formed at the surface of the first trench insulating layer 2, and a second trench insulating layer 4 formed on the surface of the shielding layer 3, the trench filling layer 5, which realizes the buried contact bypass line, being formed in the upper section of the isolation trench T and being covered with a third trench insulating layer 6 apart from uncovered connection regions in the vicinity of the first contacts KD. Highly doped polycrystalline semiconductor material is preferably used for the shielding layer 3, it also being possible in principle to use other electrically conductive materials, such as e.g. metals, or electrically nonconductive materials, such as e.g. undoped semiconductor material or insulating material ($SiO_2$). Semiconductor materials, in particular, can in this case be deposited in a particularly simple manner and without the formation of undesirable gaps or voids in the deep trenches. Said shielding layer 3 accordingly essentially serves for improved insulation or shielding between the adjacent cells and prevents, in particular, parasitic transistors from arising along the trench in the direction of the substrate or parasitic transistors from arising along the trench from one cell array to the adjacent cell array. Punch-through or latch-up effects are thereby also reliably prevented in the same way.

In the semiconductor substrate, at least one bit line doping region 101 of the second conduction type p is formed for the purpose of realizing at least one buried bit line BSL as in the case of the prior art in accordance with FIG. 2B and electrically connected together with the second doping regions S by means of buried connection layers BS of the second conduction type.

To put it more precisely, as in the case of the prior art in accordance with FIG. 2B, such buried connection layers or buried straps BS are formed in the bit line doping region or the p-type well 101 preferably by means of ion implantation in the region of the second doping regions S, as a result of which a contact between the source regions S and the buried source line BSL or the p-type well 101 is obtained for example using a highly conductive connection layer 8 formed in self-aligning fashion at the surface of the buried connection layer BS and the second doping regions S.

Preferably, in contrast to the prior art in accordance with FIG. 2B, however, the source contacts or second contacts KS are now formed directly above the buried connection layer BS and without the use of an additional well connection doping region WA in first and second surface insulating layers I1 and I2 formed at the surface, as a result of which an area optimization or a gain in area is already obtained. In principle, the additional well connection doping regions WA may also be retained as bit line connection doping regions for the connection of the bit line doping regions 101 as in the case of the prior art in accordance with FIG. 2B.

Specifically, the actual gain in area on account of the buried contact bypass line results from the fact that a source line SL formed as a second surface bit line is now located directly above a drain line DL formed as a first surface bit line and, consequently, it is possible to realize a minimum dimension BLP (Bit Line Pitch) of a minimum bit line structure width and a minimum bit line spacing.

In this case, the first surface bit line DL has an interruption in each case in the region of the second contacts KS, which interruption is closed by the buried contact bypass line led in the isolation trench T without an additional surface requirement.

In order to improve the electrical properties in particular when realizing semiconductor circuits in the sub-100 nm range, the third trench insulating layer 6 is preferably formed as a shallow trench insulating layer by means of a so-called STI method (Shallow Trench Isolation). An optimum surface passivation of the substrate with resulting improved electrical properties of the semiconductor components formed in the semiconductor substrate is obtained in this way.

Furthermore, the substrate may have a well doping region 100 of the first conduction type n, in which the bit line doping region 101 is situated, the isolation trench T projecting beyond the well doping region 100 into the semiconductor substrate 1. Highly effective insulation structures that reliably prevent, in particular, parasitic transistor structures and also latch-up and punch-through effects are obtained in this way, in particular for high-voltage circuits. Bit line structures of this type are therefore of importance in particular for semiconductor circuits having structures in the sub-100 nm range.

Although electrical connections between the respective doping regions and the associated contacts and also the trench filling layer 5 can be realized in a particularly simple manner in particular by means of the above-described self-aligning highly conductive connection layer 8, which preferably has a silicide, connection layers 8 of this type, in accordance with a further exemplary embodiment that is not illustrated, can also be realized directly by means of correspondingly configured contacts KS and KD.

Accordingly, in order to realize an electrical connection between the first doping regions D and the uncovered connection region of the trench filling layer 5, the bottom area of the first contacts KD, in accordance with the area of the connection layer 8 described above, may extend from the first doping region D as far as the uncovered connection region of the trench filling layer 5. In the same way, the second contact KS may also have a bottom area of the self-aligning connection layer 8 described above and, consequently, electrically connect the second doping regions S together with the buried connection layer BS. This results in a contact-connection of the respective first and second surface bit lines DL and SL to the associated first and second doping regions D and S and also the buried connection layers or the buried contact bypass line in a manner dependent on standard methods available in each case.

FIGS. 4A to 9C show simplified sectional views along respective sections A-A, B-B and C-C for illustrating essential method steps in the production of a bit line structure according to the invention, identical reference symbols once again designating elements or layers identical or corresponding to those in FIGS. 1 to 3B, and a repeated description being dispensed with below.

In accordance with FIGS. 4A to 4C, accordingly, after the formation of a well doping region 100 of the first conduction type n and of the bit line doping region 101 of the second conduction type p in the semiconductor substrate 1, which is preferably carried out by means of ion implantation, firstly deep isolation trenches T are formed using a patterned first hard mask layer HM1 and an underlying pad oxide PO. In this case, the isolation trench T preferably projects beyond the well doping region 100 into the semiconductor substrate 1, as a result of which highly effective insulation structures that reliably prevent, in particular, parasitic transistor structures and also latch-up and punch-through effects are obtained, in particular for high-voltage circuits.

The methods used in DRAM fabrication for the formation of deep isolation trenches are preferably carried out, but the trenches involved are not locally delimited trenches, but rather elongated isolating trenches.

Afterward, a first trench insulating layer 2, preferably in the form of a so-called liner oxide, is formed thermally, for example, at the trench surface of the isolation trenches T. While the first hard mask HM1 has $Si_3N_4$, for example, $SiO_2$ is preferably used for the first trench insulating layer 2 and the pad oxide PO.

Figure 5C:
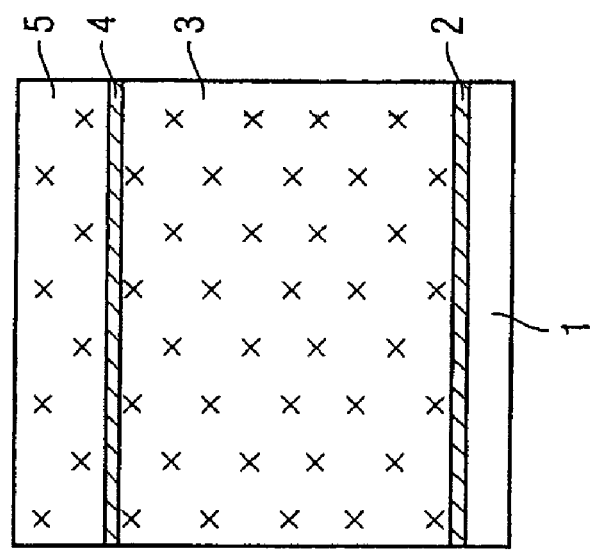
Figure 5B:
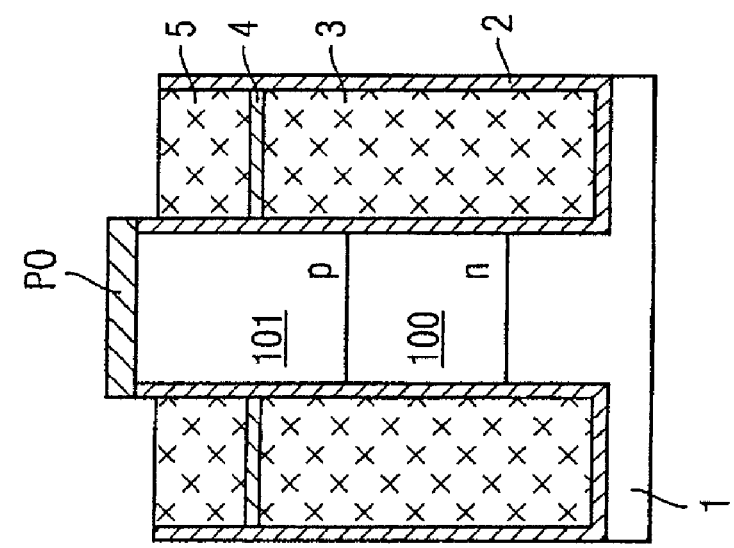
Figure 5A:
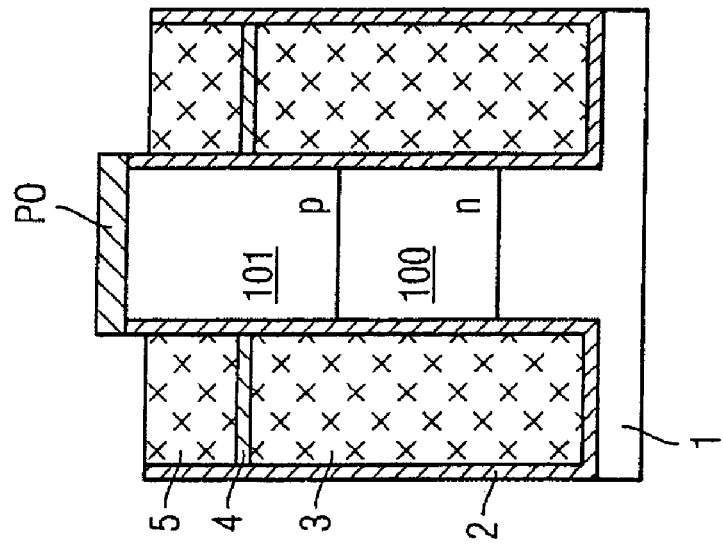

In accordance with FIGS. 5A to 5C, an electrically conductive or nonconductive shielding layer 3 is subsequently formed at the surface of the trench insulating layer 2 in a lower section of the isolation trench T, preferably a complete filling of the trench with, for example, highly doped or undoped semiconductor material (e.g. polysilicon) or some other electrically conductive or nonconductive material and a subsequent etching-back step being carried out.

A second trench insulating layer 4 is subsequently formed at the surface of the shielding layer 3, in which case, with the use of semiconductor material for the shielding layer 3, an oxide layer is preferably grown by means of thermal treatment. In order to form an electrically conductive trench filling layer 5 as a buried contact bypass line at the surface of the second trench insulating layer 4, by way of example a further deposition process is carried out for filling the trench filling layer 5 in the upper section by means of preferably highly doped semiconductor material (polysilicon), followed by etching back as far as the substrate surface, the first hard mask layer HM1 composed of $Si_3N_4$ finally being removed or stripped. It is once again also possible to use alternative electrically conductive materials for the trench filling layer 5.

Figure 6C:
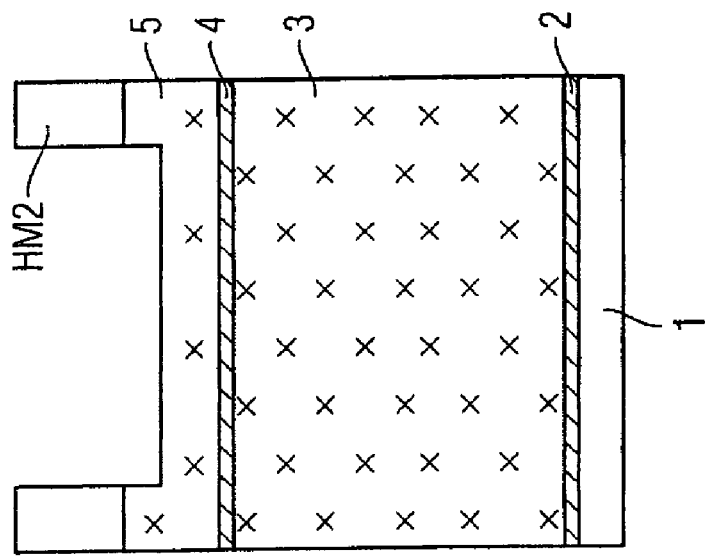
Figure 6B:
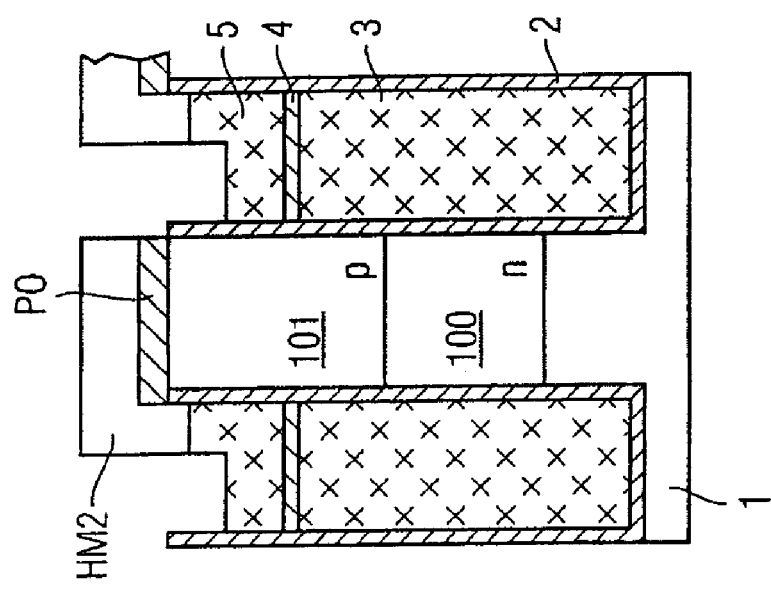
Figure 6A:
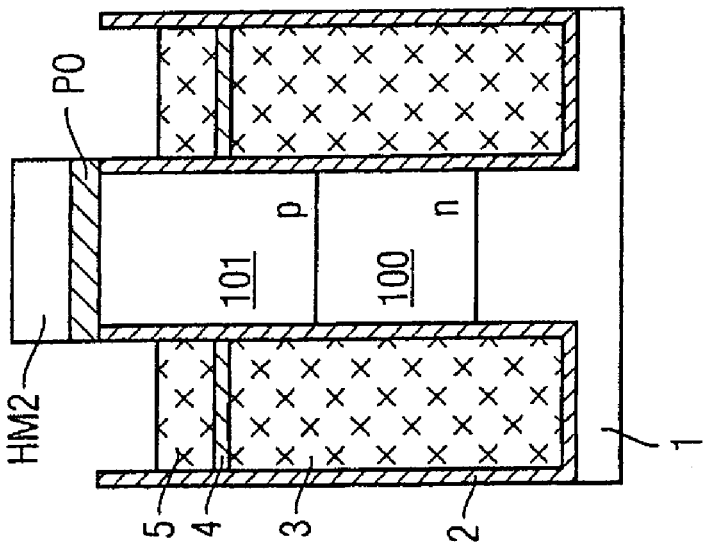

Afterward, in accordance with FIGS. 6A to 6C, using a second hard mask layer HM2, for example by means of a standard STI method, an unrequired part of the trench filling layer 5 is removed from the upper trench section, the second hard mask layer also again having $Si_3N_4$ and, in particular, at least partly covering the connection regions of the trench filling layer 5 that are provided for the buried contact bypass line. As an alternative, at this point in time, it is possible to carry out a further formation of an oxide layer in the uncovered regions, thus resulting in a further liner oxide in the uncovered shallow trench.

In accordance with FIGS. 7A to 7C, the second hard mask layer HM2 is then subjected to a so-called "pull-back" etching, as a result of which this layer is partly etched back and the edges are rounded. This is followed, for example by means of an HDP method (High Density Plasma), by a deposition of a third trench insulating layer 6 preferably as a shallow trench isolation (STI), as a result of which the uncovered upper section of the trench T is now filled again apart from the connection regions of the trench filling layer 5 which are covered by the residual second hard mask layer HM2. In order to remove the residual pad oxide layer PO and also the residual second hard mask layer HM2, it is possible to carry out, by way of example, a chemical mechanical polishing (CMP) with subsequent HF dipping.

Furthermore, at this point in time, in a surface section of the semiconductor substrate that is not illustrated, it is possible for example to implement a high-voltage dielectric and the removal preferably of a first part of this high-voltage dielectric on the relevant cell area illustrated in the figures.

In accordance with FIGS. 8A to 8C, afterward, once again by means of conventional methods, by way of example, the semiconductor components are formed at the surface of the substrate, in the present case non-volatile semiconductor memory elements SE, for example, being realized by forming and patterning word line stacks WL having a first insulating layer or a tunnel insulating layer 7A, an overlying charge-storing layer 7B, an overlying second insulating layer or ONO layer sequence 7C, and also a concluding control layer 7D.

Furthermore, in this case the spacers SP and also the trimmed spacers TSP are formed at the sidewalls of the word line stacks formed in strip-type fashion, with which the formation of the first and second doping regions S and D and also of the buried connection layer BS is usually carried out preferably by means of ion implantation. In the same way, it is also possible in this case to form spacer structures (not illustrated) for the realization of so-called connection doping regions. If appropriate, it is furthermore possible, for the realization of conventional bit line connection doping regions for the connection of the bit line doping region 101, by way of example, also to form conventional well connection doping regions WA as in the case of the prior art in accordance with FIG. 2B.

In particular for forming the buried connection layer BS, accordingly, the spacers pointing toward the second contact KS are trimmed or processed, as a result of which trimmed spacers TSP having a reduced thickness are obtained. Using these trimmed spacers TSP, the formation of the buried connection layers BS of the second conduction type may accordingly be carried out in a self-aligning manner preferably by means of ion implantation.

In accordance with FIGS. 9A to 9C, highly conductive connection layers 8 for electrically connecting the first and second doping regions D and S to the trench filling layer 5 or the buried connection layer BS are formed after the removal of, in particular, the residual second hard mask layer HM2 at the connection regions of the trench filling layer 5.

In order to form the highly conductive connection layers 8 in a self-aligning manner, by way of example, firstly silicidable material or a silicidable metal layer such as e.g. cobalt, nickel or platinum is deposited over the whole area. This is followed by a conversion of the surface layer of the uncovered semiconductor material using the silicidable material for the formation of highly conductive connection regions 8 and also optionally of highly conductive control layers 7F of the word line stacks WL, no silicide being formed at the surfaces that are not in contact with semiconductor material (silicon), rather the deposited material (metal) remaining, for which reason the deposited—but not silicided—metal layer can be etched back selectively by means of a preferably wet-chemical etching method. In this way, the highly conductive connection layers 8 and also the highly conductive control layer 7F can be formed in a self-aligning manner.

Afterward, a first surface insulating layer I1 is formed as an intermediate dielectric at the substrate surface and the first contacts or drain contacts KD are produced therein above the first doping regions D. The first contacts KD preferably comprise contact holes (vias) leading to the connection layers 8 above the first doping regions D, in which a TiN layer is preferably formed as a barrier layer with a tungsten layer as a filling layer. Afterward, a first surface bit line BL is formed at the surface of the first surface insulating layer I1 or in a first metallization plane, which surface bit line makes contact with the first doping regions D via the first contacts KD.

Afterward, a second surface insulating layer I2 is formed at the surface of the first surface insulating layer I1 or the first surface bit line BL and second contacts or source contacts KS are once again formed above the buried connection layers BS as far as the associated highly conductive connection layer 8 in the second surface insulating layer I1, I2 in a manner similar to the first contacts KD. Finally, at the surface of the second surface insulating layer I2 or in a second metallization plane, an electrically conductive layer is deposited over the whole area and patterned in such a way as to produce a second surface bit line SL, which makes contact with the second doping regions S via the second contacts KS.

A bit line structure with a minimum bit line spacing BLP (Bit Line Pitch) is obtained in this way, thus resulting in an area optimization and improved integration densities. Furthermore, on account of the particular insulation construction, semiconductor circuits having outstanding electrical properties can be realized even in the sub-100 nm range.

The invention has been described above on the basis of a non-volatile SNOR semiconductor memory circuit. However, it is not restricted thereto and encompasses in the same way further semiconductor circuits which have a corresponding bit line structure. Furthermore, the invention is not restricted to the described silicon semiconductor substrates and associated materials, but rather encompasses in the same way alternative semiconductor materials with corresponding dopings or insulating possibilities. In the same way, it is also possible for the source and drain regions and also the associated source and drain lines to be correspondingly interchanged.

It is therefore intended that the foregoing detailed description be regarded as illustrative rather than limiting, and that it be understood that it is the following claims, including all equivalents, that are intended to define the spirit and scope of this invention.

The invention claimed is:

1. A bit line structure comprising:
   a semiconductor substrate comprising a plurality of semiconductor components, each semiconductor component comprising a first doping region of a first conduction type and a second doping region of a second conduction type, wherein the first conduction type is opposite to the second conduction type;
   a bit line doping region of the second conduction type formed in the semiconductor substrate, the bit line doping region comprising at least one buried bit line electrically connected to the second doping regions of the plurality of semiconductor components;
   at least one isolation trench formed in the semiconductor substrate, the at least one isolation trench substantially parallel to the bit line and operative to insulate the bit line;
   a first surface insulating layer formed at the surface of the semiconductor substrate;
   a first surface bit line formed at the surface of the first surface insulating layer and electrically connected to the first doping regions of the plurality of semiconductor components via a first plurality of contacts;
   a second surface insulating layer formed at the surface of at least one of the first insulating layer or the first surface bit line; and
   a second surface bit line formed at the surface of the second surface insulating layer and electrically connected to the second doping regions of the plurality of semiconductor components via a second plurality of contacts;
   wherein the first surface bit line has an interruption in the region of the second plurality of contacts;
   wherein the at least one isolation trench comprises an electrically conductive trench filling layer formed at least in a region of the first and second plurality of contacts, the at least one isolation trench electrically connecting the first doping regions of the plurality of semiconductor components; and
   wherein the at least one isolation trench comprises a buried contact bypass line in the region of the first and second plurality of contacts that is an electrically conductive trench filling layer.

2. The bit line structure of claim 1, wherein the isolation trench comprises:
   a first trench insulating layer formed at a surface of the isolation trench;
   a shielding layer formed at the surface of the first trench insulting layer; and
   a second trench insulating layer formed at a surface of the shielding layer;
   wherein the trench filling layer is formed on an upper section of the isolation trench.

3. The bit line structure of claim 1, wherein the second doping regions of the plurality of semiconductor components are connected to the buried bit line via a plurality of associated buried connection layers, and the plurality of second contacts is formed substantially above at least one the plurality of associated buried connection layers or a well connection doping regions connecting the at least one buried bit line.

4. The bit line structure of claim 3, wherein the plurality of second contacts is connected to the second doping regions of the plurality of semiconductor components and at least one of the plurality of associated buried connection layers.

5. The bit line structure of claim 1, further comprising a shallow trench insulating layer formed at the surface of the trench filling layer.

6. The bit line structure of claim 1, wherein the first contacts of the plurality of first contacts adjoining the plurality of second contacts are connected to the first regions of the plurality of semiconductor components adjoining the second contact.

7. The bit line structure of claim 1, wherein the substrate further comprising a well doping region, the bid line doping region is formed in the well doping region and the isolation trench projects beyond the well doping region.

8. The bit line structure of claim 1, wherein the plurality of semiconductor components comprises a plurality of non-volatile memory elements arranged in a matrix fashion, each of the plurality of nonvolatile memory elements comprising a first insulating layer, a charge-storing layer, a second insulating layer, and a control layer.

9. A method for production of a bit line structure, comprising:
   forming a bit line doping region in a substrate;
   forming an isolation trench in the substrate;
   forming a first trench insulating layer at a trench surface of the isolation trench;
   forming a shielding layer at the surface of the trench insulating layer in a lower section of the isolation trench;
   forming a second trench insulating layer at a surface of the shielding layer;
   forming an electrically conductive trench filling layer as a buried contact bypass line at a surface of the second trench insulating layer;
   forming a third trench insulating layer at a surface of the trench filling layer, the third trench insulating layer formed at least in a region of a second contact;
   forming a plurality of semiconductor components, the plurality of semiconductor components electrically connected and each comprising a first and a second doping region at a surface of the substrate;
   forming at least one bit line connection doping region for a connection of the bit line doping region;
   forming a first surface insulating layer at the substrate surface;
   forming a first contact adjoining the second contact in the first surface insulating layer;
   forming a first surface bit line at the surface of the first surface insulating layer at a surface of the first surface insulating layer, wherein the first surface bit line forms an interruption in the region of the second contact;

forming a second surface insulating layer at a surface of at least one of the first surface insulating layer or the first surface bit line;

forming at least a second contact in the first and second surface insulating layers; and forming a second surface bit line at a surface of the second surface insulating layer.

10. The method of claim 9, wherein forming a shielding layer at the surface of the trench insulating layer in a lower section of the isolation trench comprises:

depositing a material as the shielding layer in the isolation trench and etching back.

11. The method of claim 9, where the third trench insulating layer is formed by a Shallow Trench Isolation ("STI") method.

12. The method of claim 9, wherein the first contact connects an uncovered connection region of the trench filling layer to an associated first doping region.

13. The method of claim 9, wherein forming at least one bit line connection doping region comprises forming a bit line connection doping region, buried connection layers, and well connection doping regions, and wherein, and wherein the second contact is formed essentially above the bit line connection doping region.

14. The method of claim 13, wherein the substrate is crystalline silicon and the second trench filling layer is high doped polysilicon.

15. The method of claim 9, wherein the first, second, and third trench insulating layers comprise $SiO_2$.

16. The method of claim 9, wherein forming a bit line doping region in a substrate further comprises forming a well doping region of a first conduction type in the substrate, and wherein the isolation trench projects beyond the well doping region.

17. The method of claim 9, wherein the plurality of semiconductor components comprise a plurality of nonvolatile memory elements formed in a matrix fashion and comprising a first insulating layer, a charge-storing layer, a second insulating layer, and a control layer.

18. A bit line structure comprising:

a semiconductor substrate comprising at least one semiconductor component, the semiconductor component comprising a first doping region of a first conduction type and a second doping region of a second conducting type, wherein the first and second conducting types are opposite;

a bit line doping region formed in the semiconductor substrate, the bit line doping region of the second conduction type, the bit line doping region comprising at least one buried bit line electrically connected to the second doping region of the at least one semiconductor component;

at least one isolation trench formed in the semiconductor substrate, the at least one isolation trench substantially parallel to the bit line and operative to insulate the bit line;

a surface insulating layer formed at the surface of the semiconductor substrate a first surface bit line formed at the surface of the semiconductor substrate and electrically connected to the first doping region of the at least one semiconductor component via a first plurality of contacts;

a second surface insulating layer formed at the surface of the at least one of the first insulating layer or the first surface bit line; and a second surface bit line formed at the surface of the second surface insulating layer and electrically connected to the second doping region of the at least one semiconductor component via a second plurality of contacts;

wherein the first surface bit line creates an interruption in the region of the second plurality of contacts;

wherein the at least one isolation trench comprises an electrically conductive trench filling layer formed at least in a region of the first and second plurality of contacts; and wherein the at least one isolation trench comprises a buried contact bypass line in the region of the first and second plurality of contacts that is an electrically conductive trench filling layer.

19. A system for producing a bit line structure, comprising:

means for forming a bit line doping region in a substrate;

means for forming an isolation trench in the substrate;

means for forming a first trench insulating layer at a trench surface of the isolation trench;

means for forming a shielding layer at the surface of the trench insulating layer in a lower section of the isolation trench;

means for forming a second trench insulating layer at a surface of the shielding layer;

means for forming an electrically conductive trench filling layer as a buried contact bypass line at a surface of the second trench insulating layer;

means for forming a third trench insulating layer at a surface of the trench filling layer, the third trench insulating layer formed at least in a region of a second contact;

means for forming a plurality of semiconductor components, the plurality of semiconductor components electrically connected and each comprising a first and a second doping region at a surface of the substrate;

means for forming at least one bit line connection doping region for a connection of the bit line doping region;

means for forming a first surface insulating layer at the substrate surface;

means for forming a first contact adjoining the second contact in the first surface insulating layer;

means for forming a first surface bit line at the surface of the first surface insulating layer at a surface of the first surface insulating layer, wherein the first surface bit line forms an interruption in the region of the second contact;

means for forming a second surface insulating layer at a surface of at least one of the first surface insulating layer or the first surface bit line;

means for forming at least a second contact in the first and second surface insulating layers; and means for forming a second surface bit line at a surface of the second surface insulating layer.

* * * * *